US008097085B2

(12) United States Patent
Erickson et al.

(10) Patent No.: US 8,097,085 B2
(45) Date of Patent: Jan. 17, 2012

(54) THERMAL DIFFUSION CHAMBER

(75) Inventors: Mark R. Erickson, Newbury Park, CA (US); Aaron L. Dingus, Moorpark, CA (US); Arthur W. Custer, III, Ventura, CA (US); Henry J. Poole, Ventura, CA (US); Nader Jamshidi, Newbury Park, CA (US)

(73) Assignee: Poole Ventura, Inc., Oxnard, CA (US)

(*) Notice: Subject to any disclaimer, the term of this patent is extended or adjusted under 35 U.S.C. 154(b) by 0 days.

(21) Appl. No.: 13/016,667

(22) Filed: Jan. 28, 2011

(65) Prior Publication Data

US 2011/0143297 A1 Jun. 16, 2011

(51) Int. Cl.

| | |
|---|---|
| ***C23C 16/00*** | (2006.01) |
| ***C23C 16/46*** | (2006.01) |
| ***F27B 5/16*** | (2006.01) |
| ***B21D 53/02*** | (2006.01) |

(52) U.S. Cl. ........ 118/724; 118/715; 118/725; 432/200; 29/595; 29/890.03

(58) Field of Classification Search .................. 118/715, 118/724, 725; 29/592, 890.03; 432/200
See application file for complete search history.

(56) References Cited

U.S. PATENT DOCUMENTS

| | | | | |
|---|---|---|---|---|
| 2,197,876 | A | 4/1940 | Racen | |
| 3,403,243 | A | 9/1968 | Martz et al. | |
| 3,933,598 | A | 1/1976 | Pries | |
| 4,172,925 | A | 10/1979 | Chen et al. | |
| 4,266,338 | A | 5/1981 | Chen et al. | |
| 4,751,370 | A | 6/1988 | Crossley et al. | |
| 4,753,192 | A * | 6/1988 | Goldsmith et al. | 118/725 |
| 5,062,386 | A * | 11/1991 | Christensen | 118/725 |
| 5,252,141 | A | 10/1993 | Inoue et al. | |
| 5,364,488 | A * | 11/1994 | Minato et al. | 156/345.27 |

(Continued)

FOREIGN PATENT DOCUMENTS

JP 52122958 10/1977

(Continued)

OTHER PUBLICATIONS

CVD Equipment Corporation, Rapid Thermal Processing and Rapid Thermal Annealing Systems, Website: http://www.products.cvdequipment.com/products/rtp/in_product6/, p. 1.

(Continued)

*Primary Examiner* — Jeffrie R Lund
(74) *Attorney, Agent, or Firm* — Daniel P. Dooley; Fellers, Snider, et al.

(57) ABSTRACT

A frame supporting a containment chamber, the containment chamber is preferably configured to enclose and confine a process chamber. A heat source module is disposed between the containment chamber and the process chamber, while a thermal regulation cavity is maintained between the heat source module and the process chamber. Preferably, at least one fluid inlet box is in fluidic communication with the thermal regulation cavity, in which the fluid inlet box provides a plate valve that mitigates the flow of fluids from the thermal regulation cavity through the fluid inlet box and to an environment external to the thermal regulation cavity. Additionally, the preferred fluid inlet box further includes a flow adjustment structure interacting with the plate valve to control fluid flow from the environment external to the thermal regulation cavity past the plate valve and into thermal regulation cavity.

20 Claims, 9 Drawing Sheets

U.S. PATENT DOCUMENTS

| | | | | |
|---|---|---|---|---|
| 5,452,396 | A | 9/1995 | Sopori | |
| 5,800,631 | A | 9/1998 | Yamada et al. | |
| 5,805,330 | A | 9/1998 | Byker et al. | |
| 5,944,899 | A * | 8/1999 | Guo et al. | 118/715 |
| 6,002,109 | A | 12/1999 | Johnsgard et al. | |
| 6,045,643 | A | 4/2000 | Byker et al. | |
| 6,095,083 | A | 8/2000 | Rice et al. | |
| 6,204,443 | B1 | 3/2001 | Kiso et al. | |
| 6,320,115 | B1 | 11/2001 | Kataoka et al. | |
| 6,367,410 | B1 * | 4/2002 | Leahey et al. | 118/723 I |
| 6,433,913 | B1 | 8/2002 | Bauer et al. | |
| 6,744,023 | B2 * | 6/2004 | Garn et al. | 219/632 |
| 6,756,566 | B2 * | 6/2004 | Moller | 219/400 |
| 6,903,306 | B2 * | 6/2005 | Moller | 219/400 |
| 6,961,168 | B2 | 11/2005 | Agrawal et al. | |
| 6,986,739 | B2 | 1/2006 | Warren et al. | |
| 7,091,453 | B2 | 8/2006 | Murayama et al. | |
| 7,119,937 | B2 | 10/2006 | Warner et al. | |
| 7,133,606 | B1 | 11/2006 | Elliott et al. | |
| 7,196,262 | B2 | 3/2007 | Gronet | |
| 7,235,736 | B1 | 6/2007 | Buller et al. | |
| 7,253,017 | B1 | 8/2007 | Roscheisen et al. | |
| 7,259,322 | B2 | 8/2007 | Gronet | |
| 7,394,016 | B2 | 7/2008 | Gronet | |
| 7,450,292 | B1 | 11/2008 | Burrell et al. | |
| 7,576,017 | B2 | 8/2009 | Tuttle | |
| 7,633,669 | B2 | 12/2009 | Burrell et al. | |
| 7,857,756 | B2 | 12/2010 | Warren et al. | |
| 2001/0027969 | A1 | 10/2001 | Takahashi et al. | |
| 2001/0027970 | A1 | 10/2001 | Li et al. | |
| 2002/0046704 | A1 | 4/2002 | Anderson | |
| 2002/0195437 | A1 | 12/2002 | Kusuda | |
| 2003/0081945 | A1 | 5/2003 | Kusuda | |
| 2003/0089132 | A1 | 5/2003 | Kusuda | |
| 2003/0091951 | A1 | 5/2003 | Guilmette et al. | |
| 2004/0013418 | A1 | 1/2004 | Kusuda et al. | |
| 2004/0013419 | A1 | 1/2004 | Sakuma et al. | |
| 2004/0018008 | A1 | 1/2004 | Koren et al. | |
| 2004/0018751 | A1 | 1/2004 | Kusuda | |
| 2004/0037543 | A1 | 2/2004 | Kusuda et al. | |
| 2006/0251827 | A1 | 11/2006 | Nowak et al. | |
| 2007/0240760 | A1 | 10/2007 | Gronet | |
| 2007/0295389 | A1 | 12/2007 | Capps et al. | |
| 2008/0017114 | A1 | 1/2008 | Watanabe et al. | |
| 2009/0023229 | A1 | 1/2009 | Matsushita et al. | |
| 2009/0025640 | A1 | 1/2009 | Sager et al. | |
| 2009/0175605 | A1 | 7/2009 | Kobayashi | |
| 2009/0289053 | A1 | 11/2009 | Ranish et al. | |
| 2010/0012035 | A1 * | 1/2010 | Nagata et al. | 118/725 |
| 2010/0012187 | A1 | 1/2010 | Paull et al. | |
| 2010/0050935 | A1 | 3/2010 | Roussillon et al. | |
| 2010/0267188 | A1 | 10/2010 | Parks et al. | |
| 2010/0300352 | A1 | 12/2010 | Roussillon et al. | |
| 2011/0143297 | A1 * | 6/2011 | Erickson et al. | 432/200 |
| 2011/0183461 | A1 * | 7/2011 | Probst | 438/95 |
| 2011/0249960 | A1 * | 10/2011 | Poole et al. | 392/408 |
| 2011/0254228 | A1 * | 10/2011 | Custer et al. | 277/312 |

FOREIGN PATENT DOCUMENTS

| | | |
|---|---|---|
| JP | 59201438 | 11/1984 |
| JP | 03278860 A * | 12/1991 |
| JP | 9326366 | 12/1997 |
| WO | 9221144 | 11/1992 |
| WO | 9510639 | 4/1995 |

OTHER PUBLICATIONS

Key High Vacuum Products, Inc., Chamber Accessories and Feedthroughs, Website: http://www.keyhigh.com/section11.pdf, pp. 1-38.

* cited by examiner

THERMAL DIFFUSION CHAMBER

FIELD OF THE INVENTION

The claimed invention relates to the field of thermal diffusion chamber equipment and methods of making thermal diffusion chambers for the production of solar energy panels, and more particularly to structures and methods of cooling an external surface of a process chamber of the thermal diffusion chamber.

BACKGROUND

A form of solar energy production relies on solar panels, which in turn rely on the diffusion of select materials onto a substrate. In one example, glass is used as the substrate, which is exposed to a gaseous selenide species to form a copper, indium and selenide containing film on the substrate. The gaseous selenide species is known to be toxic to humans, which underscores prudent handling methods, including thermal regulation systems.

As such, thermal regulation systems capable of precluding migration and leakage of the gaseous selenide species from within a process chamber to atmosphere, in an efficient and reliable manner, can greatly improve the operation and production output of thermal chambers used in providing substrates a copper, indium and selenide containing film diffused within them.

Accordingly, there is a continuing need for improved mechanisms and methods of thermal regulation of the process chamber for thermal diffusion chambers.

SUMMARY OF THE INVENTION

The present disclosure relates to thermal diffusion chambers and in particular to thermal control systems and methods for controlling the temperature of a process chamber of thermal diffusion chamber equipment.

In accordance with various exemplary embodiments, a frame supporting a containment chamber is constructed. The containment chamber is configured to support, enclose, and confine a process chamber confined within the containment chamber. In the exemplary embodiment, a heat source module is disposed between the containment chamber and the process chamber, and a thermal regulation cavity is formed between the heat source module and the process chamber. In the exemplary embodiment, and at least one fluid inlet box is in fluidic communication with the thermal regulation cavity, the fluid inlet box preferably provides a plate valve that mitigates the flow of fluids from the thermal regulation cavity through the fluid inlet box and to an environment external to the thermal regulation cavity. Preferably, the fluid inlet box further includes a flow adjustment structure interacting with the plate valve to control fluid flow from the environment external to the thermal regulation cavity past the plate valve and into thermal regulation cavity.

In an alternate exemplary embodiment, a method of forming a thermal diffusion chamber includes at least the steps of providing a frame, supporting a containment chamber on the frame, and disposing a heat source module within the containment chamber. With the heat source module in position, a process chamber is enclosed, confined, and supported within the heat source module, which forms a thermal regulation cavity located between the heat source module and the process chamber. With the thermal regulation cavity formed, a next step involves securing at least one fluid inlet box in fluidic communication with the thermal regulation cavity, in which the fluid inlet box provides a plate valve that mitigates the flow of fluids from the thermal regulation cavity through the fluid inlet box and to the environment external to the thermal regulation cavity, and wherein the fluid inlet box further includes a flow adjustment structure interacting with the plate valve to control fluid flow from the environment external to the thermal regulation cavity past the plate valve and into thermal regulation cavity.

Then by reducing pressure in an outlet manifold to a value below atmospheric pressure, in which the outlet manifold in fluidic communication with the thermal regulation cavity, accommodates the drawing of fluid past the plate valve of the inlet fluid box, around the process chamber and out a purge conduit, wherein the purge conduit is secured between the outlet manifold and the thermal regulation cavity.

These and various other features and advantages that characterize the claimed invention will be apparent upon reading the following detailed description and upon review of the associated drawings.

DETAILED DESCRIPTION OF AN EXEMPLARY EMBODIMENT OF THE DRAWINGS

Reference will now be made in detail to one or more examples of various embodiments of the present invention depicted in the figures. Each example is provided by way of explanation of the various embodiments of the present invention, and not meant as a limitation of the invention. For example, features illustrated or described as part of one embodiment may be used with another embodiment to yield still a different embodiment. Other modifications and variations to the described embodiments are also contemplated within the scope and spirit of the claimed invention.

Figure 1:
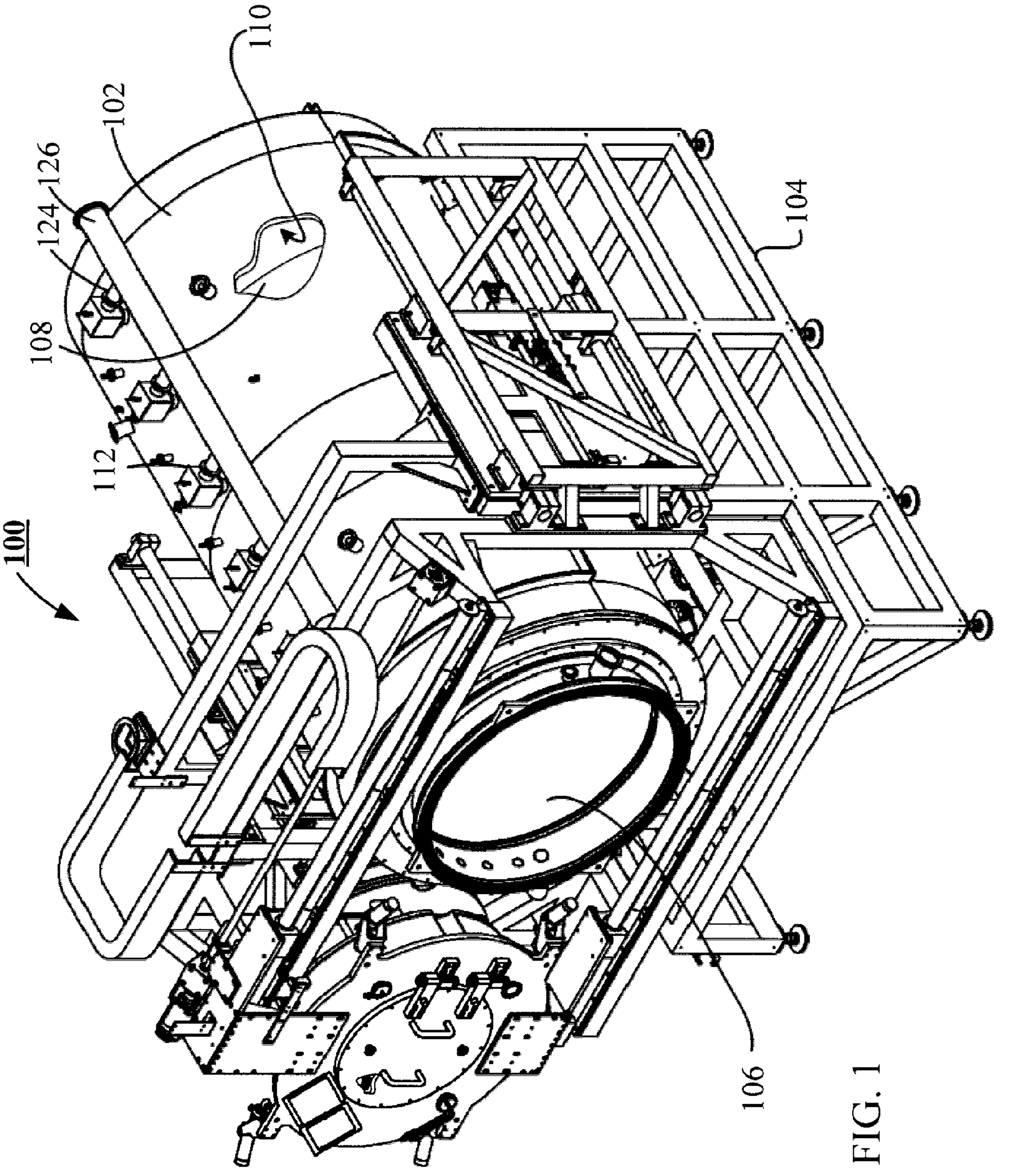
FIG. 1 displays an orthogonal projection, with partial cutaway, of an exemplary embodiment of a thermal chamber of the claimed invention.

Turning to the drawings, FIG. 1 displays an exemplary thermal diffusion chamber 100 which includes at least a containment chamber 102 supported by a frame 104, which in turn supports a process chamber 106. Preferably the exemplary thermal diffusion chamber 100 further includes a heat source module 108 disposed between the process chamber

106 and the containment chamber 102, and a thermal regulation cavity 110 formed between the process chamber 106 and the heat source module 108. FIG. 1 further shows that at least one fluid inlet box 112 is provided, which is in fluidic communication with the thermal regulation cavity 110.

Figure 2:
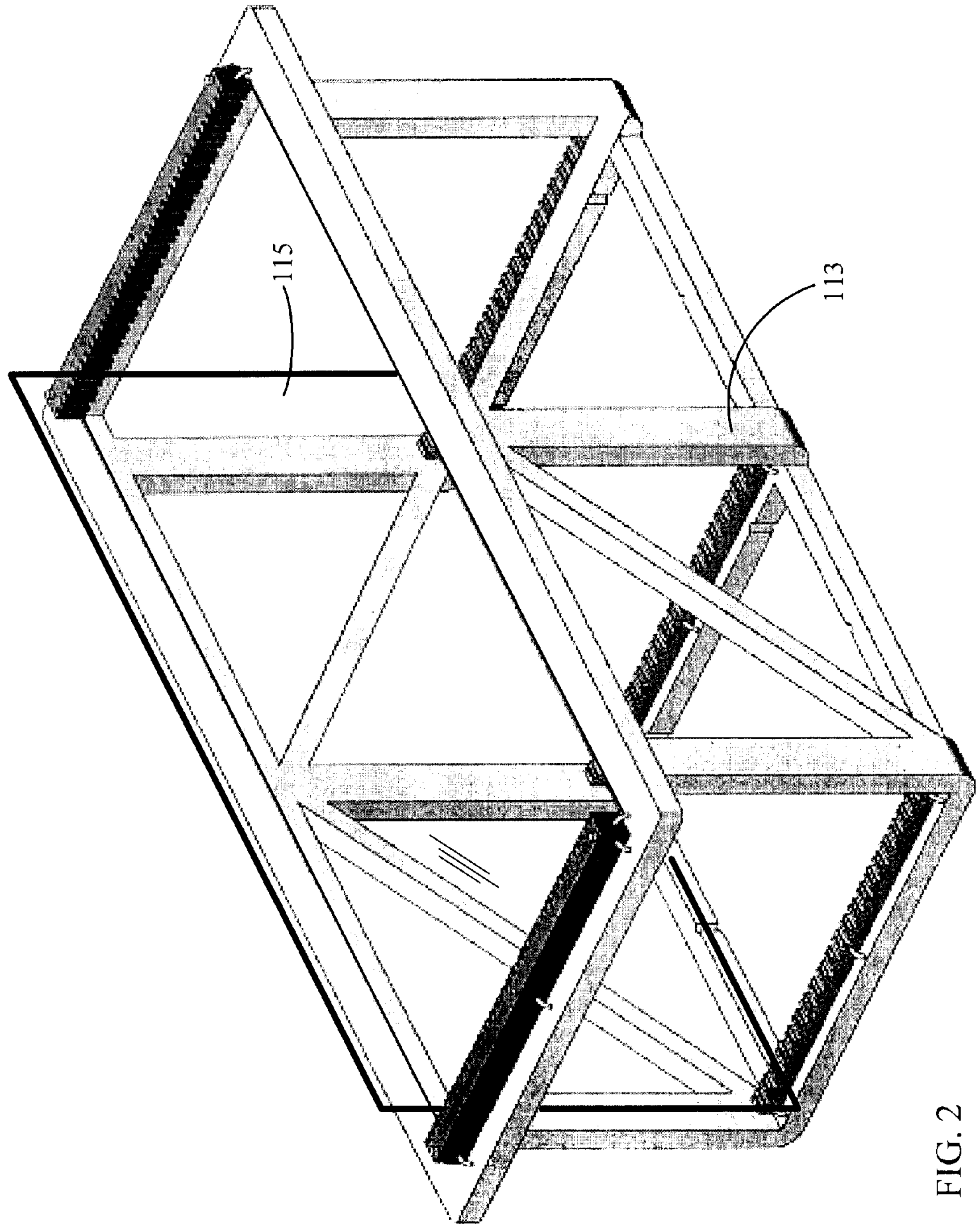
FIG. 2 provides an orthogonal projection of an exemplary substrate support frame configured for use with the exemplary embodiment of the thermal chamber of FIG. 1.

FIG. 2 shows exemplary substrate support frame 113 configured for use with the exemplary embodiment of the thermal diffusion chamber 100 (of FIG. 1). In a preferred embodiment, the substrate support frame 113 is formed from quarts and accommodates plurality of substrates 115 (one shown). In operation, the substrate support frame 113 is filled to capacity with substrates 115 and positioned within the process chamber 106. Within the process chamber 106, the substrate support frame 113, serves as a fixture for the substrates 115 during the diffusion process. Preferably the substrates 115 are rectangular in shape having a width of substantially 650 millimeters and a length of substantially 1650 millimeters, and are formed from glass, preferably soda-lime-silica glass.

Figure 3:
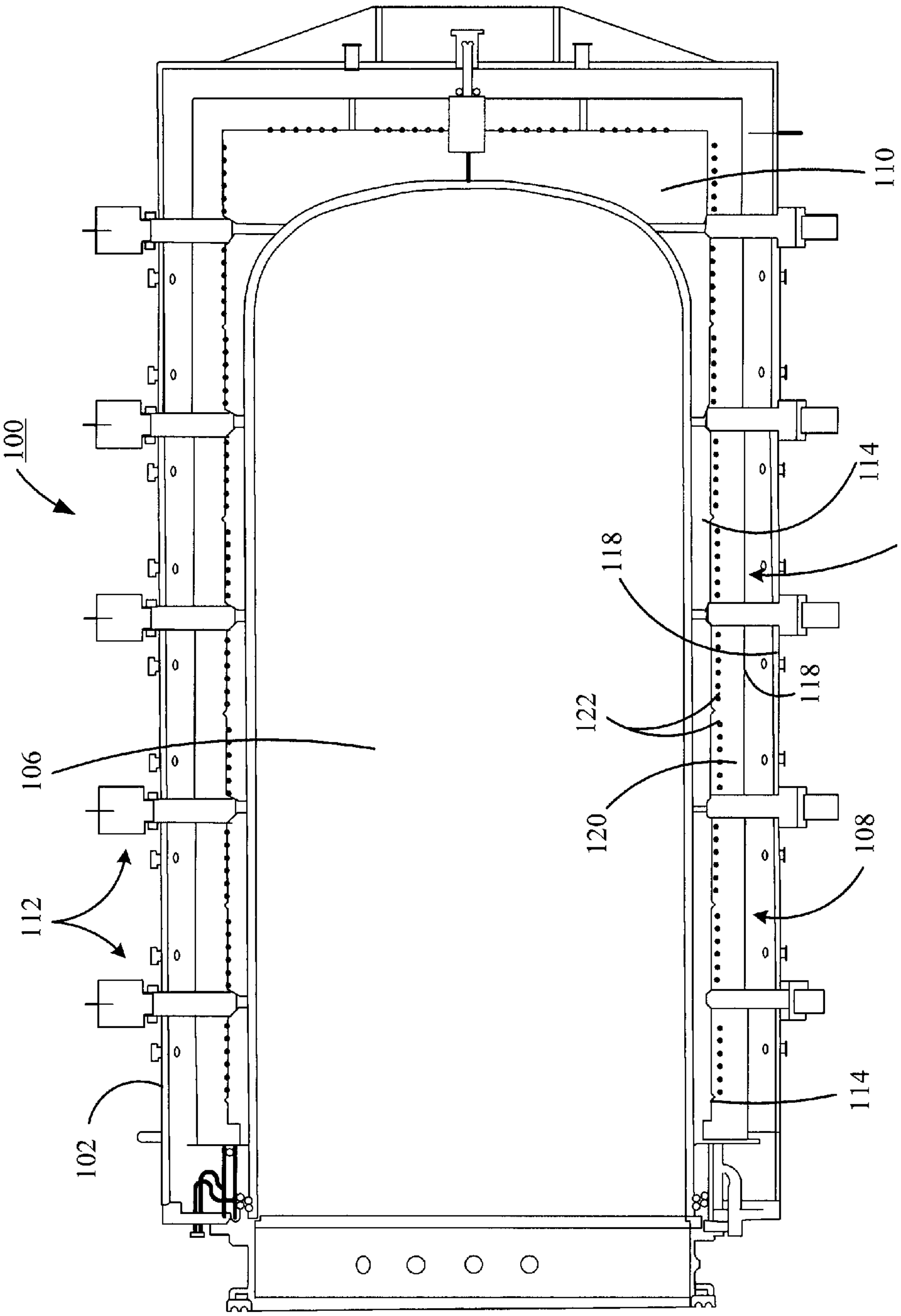
FIG. 3 shows a cross-sectional, right side elevation view of the exemplary embodiment of the thermal chamber of FIG. 1.

The cross-sectional, right side elevation view of the thermal diffusion chamber 100 shown by FIG. 3 provides a more detailed depiction of the inlet boxes 112 in fluid communication with the thermal regulation cavity 110. Further shown by FIG. 3 is a plurality of supports 114 preferably positioned between the heat source module 108 and the process chamber 106.

In a preferred exemplary embodiment, the heat source module 108 is formed from a plurality of heaters 116, which in an exemplary embodiment consists of substantially a total of twenty two (22) heaters. Preferably, each heater provides a heater shell 118, heater insulation 120 adjacent the heater shell 118, and a plurality of heating elements 122. In an exemplary embodiment, the heating elements 122 are powered by electricity, and are preferably a coiled element.

Returning to FIG. 1, which shows the fluid inlet box 112 further includes an inlet conduit 124 secured to an inlet manifold 126. Preferably the inlet manifold 126 delivers fluid to the fluid inlet boxes 112 for distribution over the process chamber 106, as depicted in FIG. 4.

Figure 4:
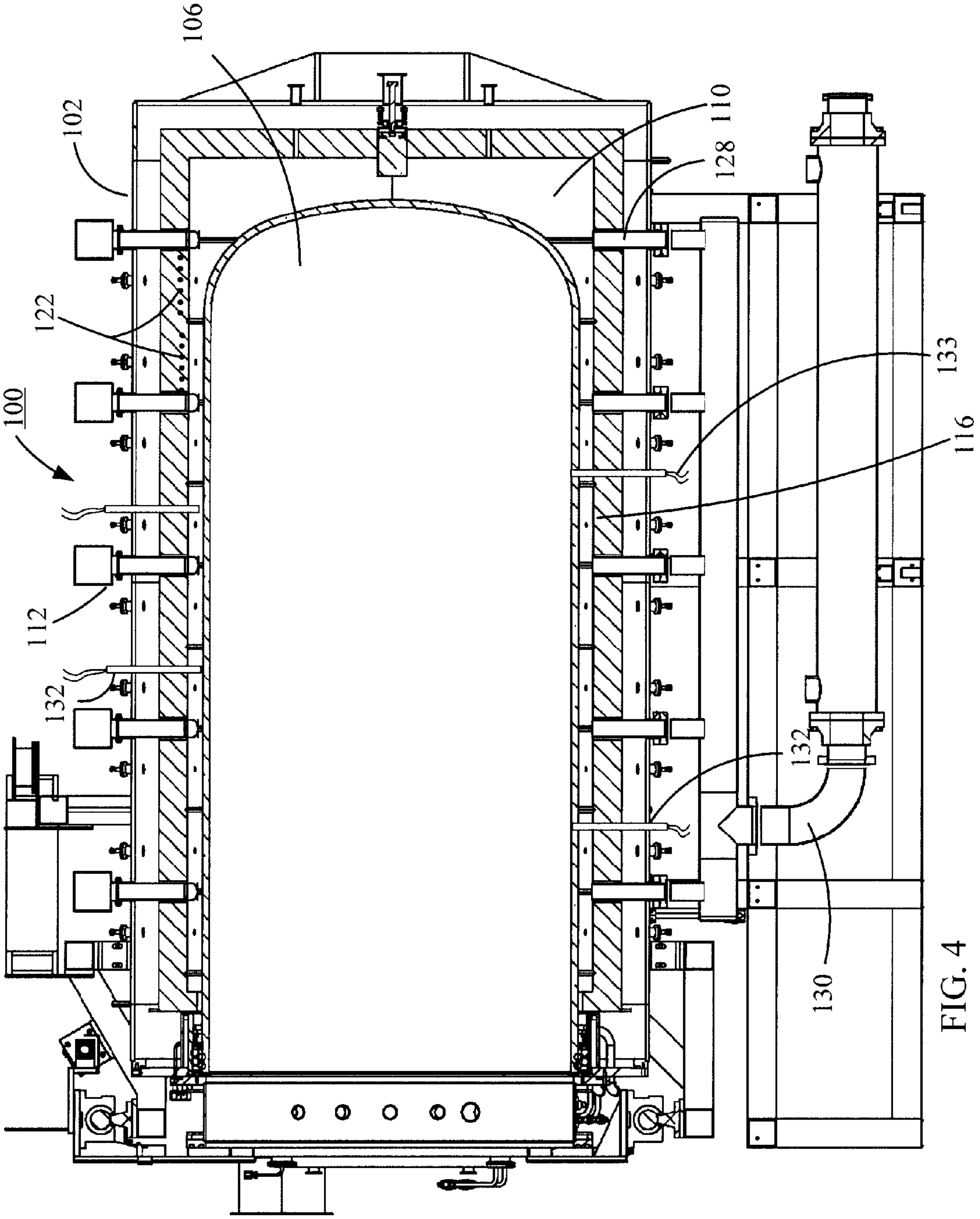
FIG. 4 illustrates a cross-sectional, right side elevation view of the exemplary embodiment of the thermal chamber of FIG. 1 showing an exhaust manifold and conduit.

FIG. 4 further shows the exemplary thermal diffusion chamber 100 includes a purge conduit 128 in fluidic communication with the thermal regulation cavity 110 and secured to an outlet manifold 130, the outlet manifold 130 selectively providing an internal pressure less than atmospheric pressure to draw fluid through the fluid inlet box 112, around the process chamber 106, and out the purge conduit 128.

Also shown by FIG. 4, is a plurality of thermal sensors 132 in contacting adjacency with the process chamber 106, extending through corresponding heaters 116, and presenting electrical lead lines 133 for connection from the outside of the containment chamber 102. In a preferred mode of operation of the exemplary thermal diffusion chamber 100, fluid flow is suspended, i.e., the fluid flow undergoes fluid flow modulation, to provide a more accurate reading of the external temperature of the process chamber 106. Information collected from the plurality of thermal sensors 132 is used to determine which fluid inlet boxes 112 should undergo a restriction of fluid flow, and which should be adjusted for maximum fluid flow.

By adjusting the fluid flow through the plurality of fluid inlet boxes 112, a more uniform cool down of the process chamber 106 may be attained. Further, in an alternate preferred mode of operation of the exemplary thermal diffusion chamber 100, the plurality of thermal sensors 132 provide information for regulating the amount of power supplied to the heating elements 122 during a heat up cycle of the process chamber 106. That is, during a heat up cycle of the process chamber 106, power being supplied to each of the plurality of heaters 116. By modulating the power supplied to each of the plurality of heaters 116 can be modulated, and a more uniform heat up of the process chamber 106 may be attained.

Figure 5:
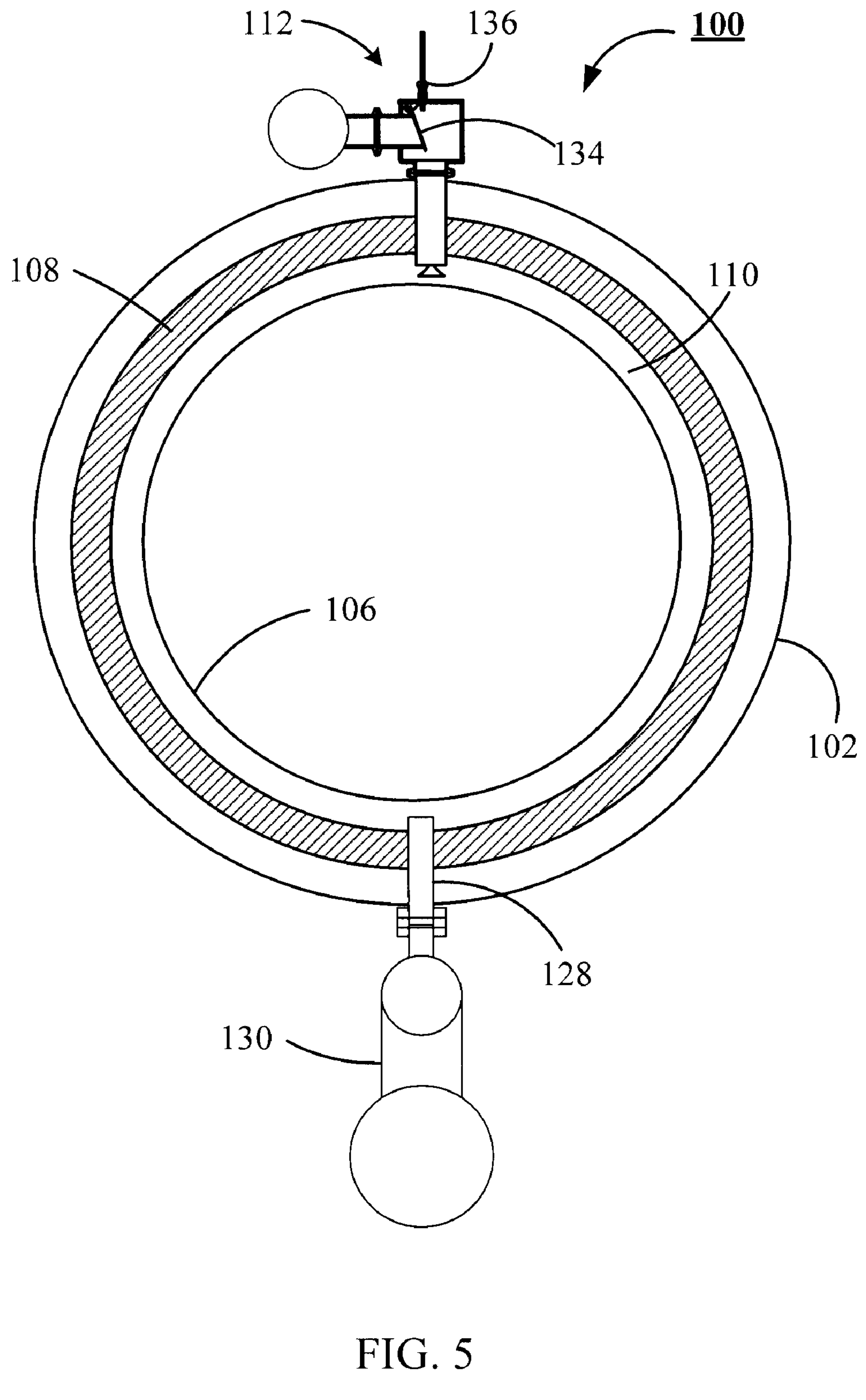
FIG. 5 provides a cross-sectional, front elevation view of the exemplary embodiment of the thermal chamber of FIG. 1.

FIG. 5 depicts the fluid inlet box 112 includes a plate valve 134, which mitigates the flow gases from the thermal regulation cavity 110 through the fluid inlet box 112 and to an environment external to the thermal regulation cavity. FIG. 5 further shows the fluid inlet box 112 includes a flow adjustment structure 136 that interacts with the plate valve 134 to control fluid flow from the environment external to the thermal regulation cavity past the plate valve 134 and into the thermal regulation cavity 110.

Figure 6:
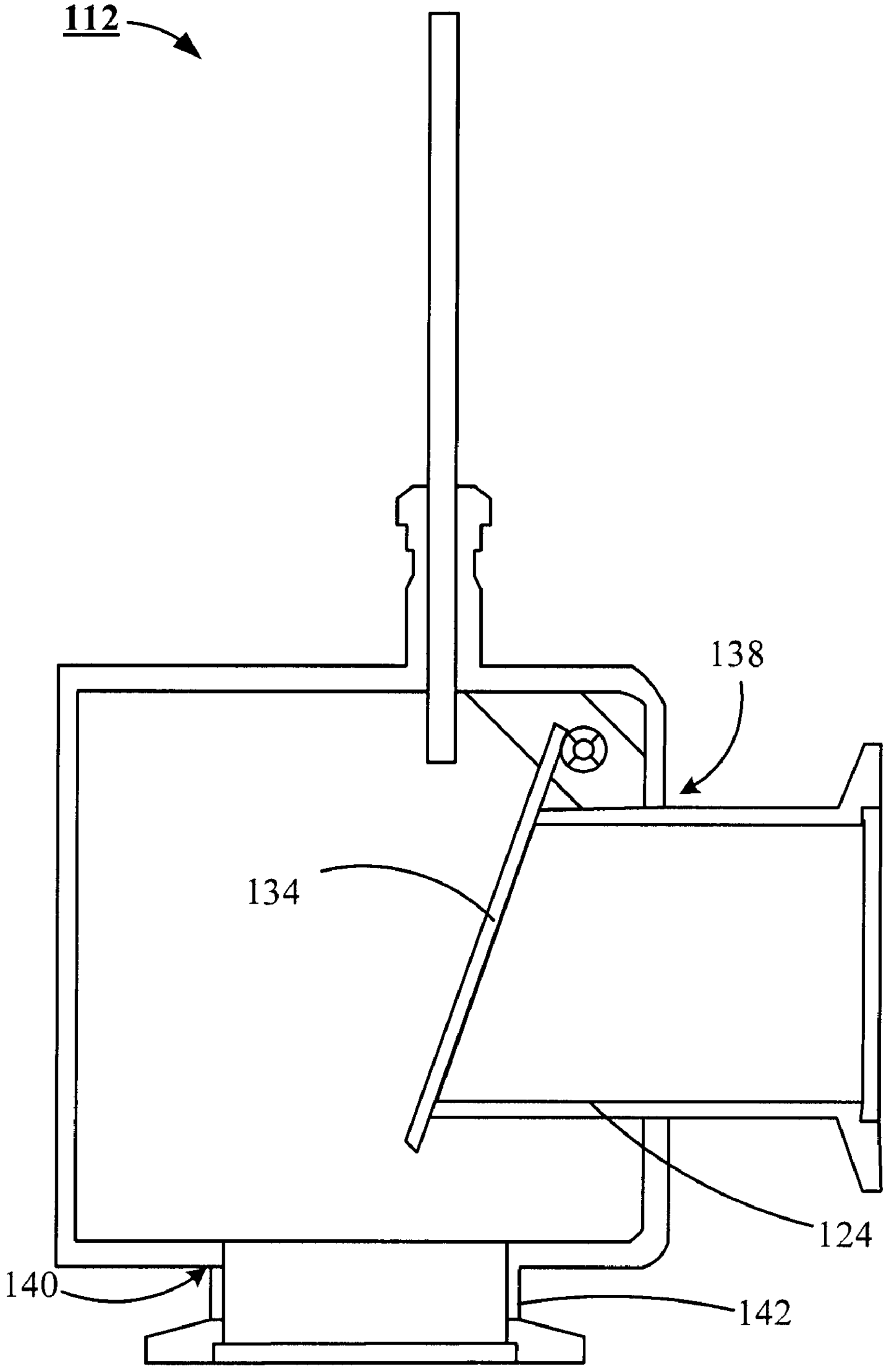
FIG. 6 displays an enlarged detailed cross-sectional, elevation view of a fluid inlet box of the exemplary embodiment of the thermal chamber of FIG. 1.

FIG. 6 provides a more detailed view of the fluid inlet box 112. In a preferred embodiment, the fluid inlet box 112 further provides an intake port 138 supporting the inlet conduit 124, which is in contacting adjacency with the plate valve 134. Preferably, the inlet box 112 further provides an exhaust port 140 that supports an outlet conduit 142 that is in fluidic communication with the thermal regulation cavity 110.

Figure 7:
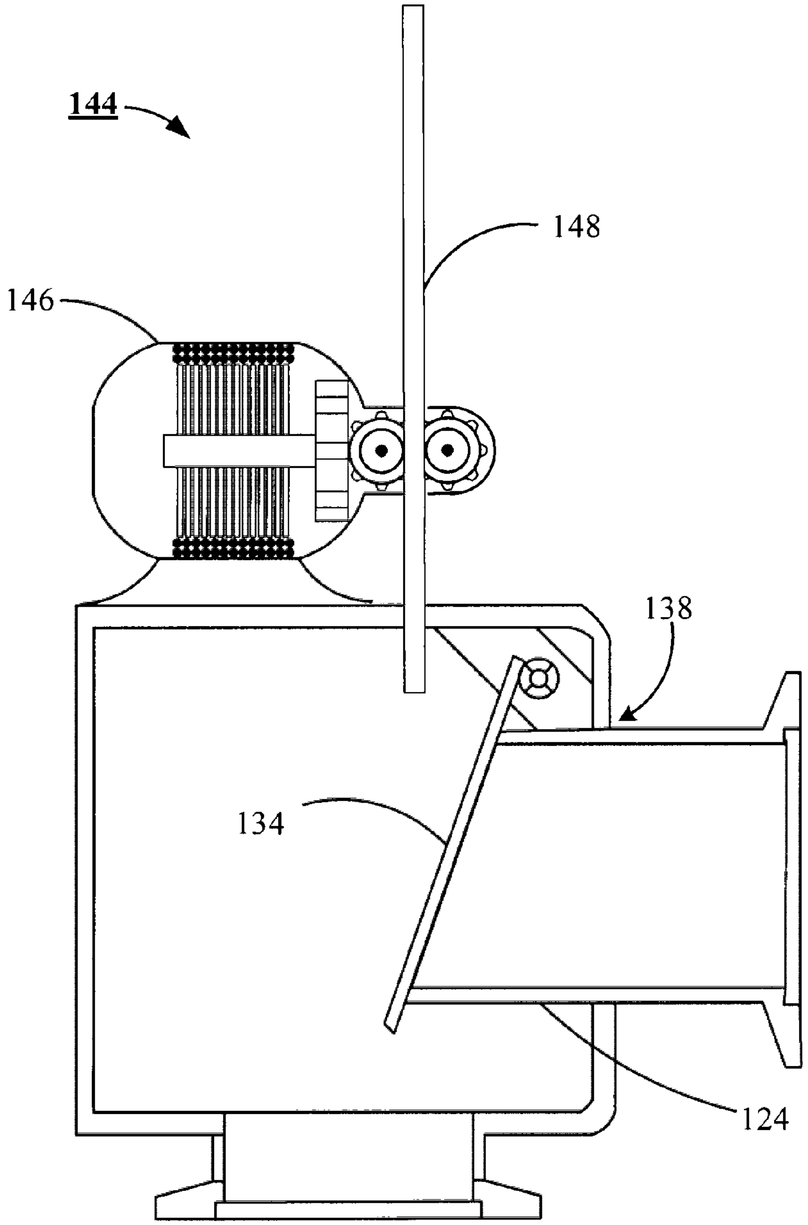
FIG. 7 shows an enlarged detailed cross-sectional, elevation view of a motorized fluid inlet box of the exemplary embodiment of the thermal chamber of FIG. 1.

FIG. 7 provides a detailed view of an alternate fluid inlet box 144. In a preferred embodiment, in addition to providing the intake port 138 supporting the inlet conduit 124, which is in contacting adjacency with the plate valve 134, the fluid inlet box 144 provides a motor 146 interacting with a flow control rod 148 that interacts with the plate valve 134 to control fluid flow from the environment external to the thermal regulation cavity past the plate valve 134 and into the thermal regulation cavity 110, in response to the thermal sensors 132 of FIG. 4 detecting an imbalance in temperature of the process chamber 106 of FIG. 4.

Figure 8:
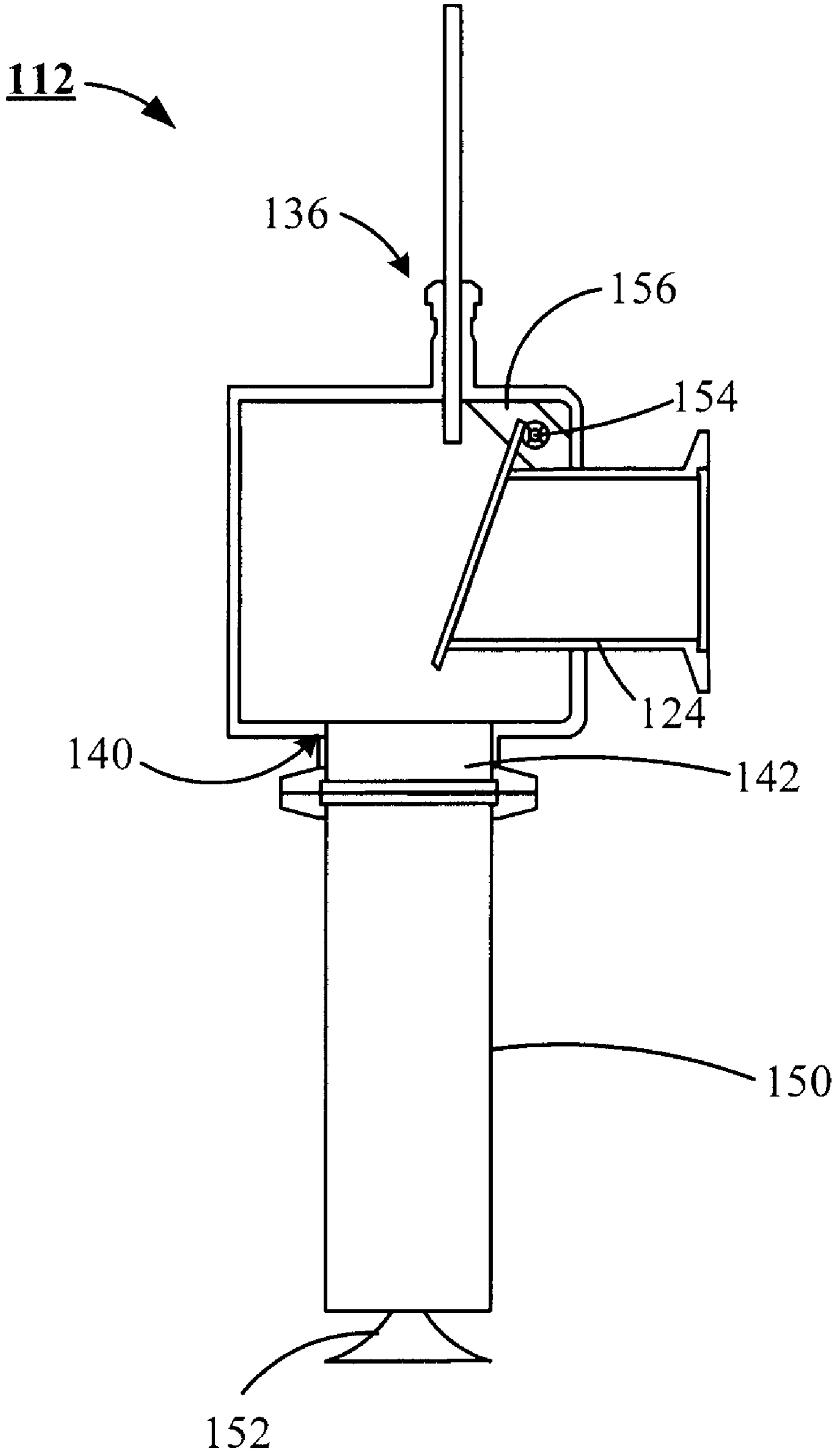
FIG. 8 depicts an enlarged detailed cross-sectional, elevation view of a fluid inlet box with an attached inlet conduit of the exemplary embodiment of the thermal chamber of FIG. 1.

FIG. 8 provides an enhanced view of the fluid inlet box 112. In a preferred embodiment, in addition to providing the exhaust port 140 supporting the outlet conduit 142, the fluid inlet box 112 provides an extension conduit 150 having a proximal end and a distal end, the proximal end in contacting adjacency with and secured to the outlet conduit 142, the extension conduit 150 is provided to conduct fluid from the environment external to the thermal regulation cavity to the thermal regulation cavity 110 of FIG. 5. The distal end of the extension conduit 150 is preferably fashioned with a diffusion member 152 affixed thereon, wherein the diffusion member 152 is configured to preclude fluid conducted from the environment external to the thermal regulation cavity from being applied to the process chamber 106 of FIG. 5 in a stream normal to the process chamber 106.

FIG. 8 further shows the fluid inlet box 112 further provides a pivot pin 154 disposed between the plate valve 134 and a pivot support 156. The pivot support 156 is secured adjacent the inlet conduit 124. The pivot pin 154, in combination with the flow adjustment structure 136, promotes a controlled, predetermined, and adjustable displacement of the plate valve 134 from contacting adjacency with the inlet conduit 124 when fluid is drawn into the thermal regulation cavity 110. The pivot pin 154 further promotes the closing of the plate valve 134 adjacent the inlet conduit 124 when source fluid is stopped. In other words, a closed plate valve 134 deters passage of fluids from the thermal regulation cavity 110 to the environment external to the thermal regulation cavity when fluid is not being drawn into the thermal regulation cavity 110.

Figure 9:
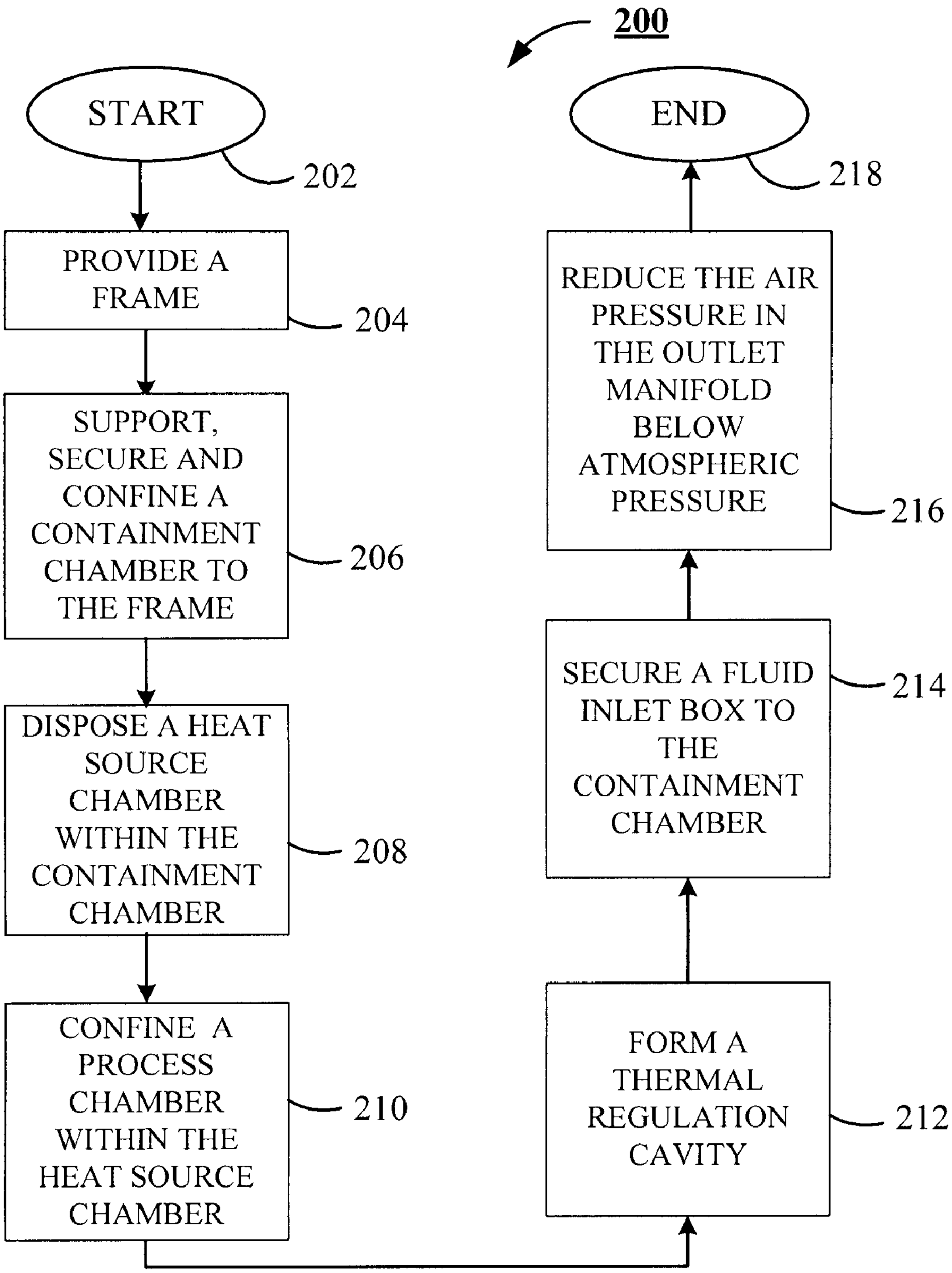
FIG. 9 generally illustrates a flow chart of a method of forming an exemplary embodiment of the thermal chamber of FIG. 1.

FIG. 9 provides an exemplary method of making a thermal chamber 200 conducted in accordance with various embodiments of the present invention. The method of making a thermal chamber 200 commences at start process step 202 and continues with process step 204. At process step 204, a frame (such as 104) is provided. At process step 206, a containment chamber (such as 102) is supported and secured to the frame. At process step 208, a heat source module is disposed within and confined by the containment chamber. At process step 210, a process chamber (such as 106) is confined within the heat source module. Preferably, the process chamber includes at least an interior surface and an exterior surface.

A process step 212, a thermal regulation cavity (such as 110) is formed between the heat source module and the process chamber, to provide an ability to regulate the process chamber. While at process step 214, a fluid inlet box (such as 112) is preferably secured to the containment chamber in fluidic communication with the thermal regulation cavity. Preferably, the fluid inlet box provides a plate valve (such as 134) that mitigates the flow of fluids from the thermal regulation cavity through the fluid inlet box and to the environment external to the thermal regulation cavity, and wherein the fluid inlet box further includes a flow adjustment structure (such as 136) interacting with the plate valve to control fluid flow from the environment external to the thermal regulation cavity past the plate valve and into the thermal regulation cavity.

At process step 216, fluid pressure in an outlet manifold (such as 130), which is preferably in fluidic communication with the thermal regulation cavity, is reduced to a value below atmospheric pressure, the outlet, and fluid is drawn past the plate valve of the fluid inlet box, around the process chamber and out a purge conduit (such as 128), as an outcome of reducing the pressure in the outlet manifold, wherein the purge conduit is disposed between the outlet manifold and the thermal regulation cavity, and the process concludes at end process step 218.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present claimed invention to the full extent indicated by the broad general meaning of the terms in which the appended claims are expressed. For example, the particular elements may vary depending on the particular application without departing from the spirit and scope of the present claimed invention.

It will be clear that the present invention is well adapted to attain the ends and advantages mentioned as well as those inherent therein. While presently preferred embodiments have been described for purposes of this disclosure, numerous changes may be made which will readily suggest themselves to those skilled in the art and which are encompassed by the appended claims.

What is claimed is:

1. A thermal diffusion chamber comprising:
- a frame supporting a containment chamber;
- a process chamber confined within the containment chamber;
- a heat source module disposed between the containment chamber and the process chamber;
- a thermal regulation cavity formed between the heat source module and the process chamber; and
- at least one fluid inlet box in fluidic communication with the thermal regulation cavity, in which the fluid inlet box provides a plate valve that mitigates the flow of fluids from the thermal regulation cavity through the fluid inlet box and to an environment external to the thermal regulation cavity, and wherein the fluid inlet box further includes a flow adjustment structure interacting with the plate valve to control fluid flow from the environment external to the thermal regulation cavity past the plate valve and into the thermal regulation cavity.

2. The thermal diffusion chamber of claim 1, in which the fluid inlet box further provides an intake port supporting an inlet conduit in contacting adjacency with the plate valve.

3. The thermal diffusion chamber of claim 2, in which the fluid inlet box further provides an exhaust port supporting an outlet conduit in fluidic communication with the thermal regulation cavity.

4. The thermal diffusion chamber of claim 3, in which the fluid inlet box further provides a pivot support in contacting adjacency with the plate valve.

5. The thermal diffusion chamber of claim 4, in which the fluid inlet box further provides an extension conduit having a proximal end and a distal end, the proximal end in contacting adjacency with the outlet conduit, the extension conduit conducting fluid from the environment external to the thermal regulation cavity to the thermal regulation cavity.

6. The thermal diffusion chamber of claim 5, in which the extension conduit provides at least a diffusion member affixed to the distal end of the extension conduit, wherein the diffusion member is configured to preclude fluid conducted from the environment external to the thermal regulation cavity from being applied to the process chamber in a stream normal to the process chamber.

7. The thermal diffusion chamber of claim 6, in which the fluid inlet box further provides a pivot pin disposed between the plate valve and the pivot support, the pivot pin promotes displacement of the plate valve from contacting adjacency with the inlet conduit when fluid is drawn into the thermal regulation cavity and deters passage of fluids from the thermal regulation chamber to the environment external to the thermal regulation cavity when fluid is not being drawn into the thermal regulation cavity.

8. The thermal diffusion chamber of claim 7, further comprising an inlet manifold secured to the inlet conduit, the inlet manifold conducting fluid from the environment external to the thermal regulation cavity to the inlet conduit.

9. The thermal diffusion chamber of claim 2, further comprising a purge conduit in fluidic communication with the thermal regulation cavity and secured to an outlet manifold, the outlet manifold selectively providing an internal pressure less than an internal pressure of the inlet conduit to draw fluid through the fluid inlet box, around the process chamber, and out the purge conduit.

10. The thermal diffusion chamber of claim 1, in which the process chamber is configured to accommodate a substrate disposed within the process chamber, wherein the substrate has a width of at least 650 millimeters and a length of at least substantially 1650 millimeters.

11. A method of forming a thermal diffusion chamber by steps comprising:
- providing a frame;
- supporting a containment chamber on the frame;
- disposing a heat source module within the containment chamber;
- confining a process chamber within the heat source module;
- forming a thermal regulation cavity disposed between the heat source module and the process chamber; and
- securing at least one fluid inlet box to the containment chamber in fluidic communication with the thermal regulation cavity, in which the fluid inlet box provides a plate valve that mitigates the flow of fluids from the thermal regulation cavity through the fluid inlet box and to an environment external to the thermal regulation cavity, and wherein the fluid inlet box further includes a flow adjustment structure interacting with the plate valve to control fluid flow from the environment external to the thermal regulation cavity past the plate valve and into thermal regulation cavity.

12. The method of claim 11, in which the fluid inlet box further provides an intake port supporting an inlet conduit in contacting adjacency with the plate valve.

13. The method of claim 12, in which the fluid inlet box further provides an exhaust port supporting an outlet conduit in fluidic communication with the thermal regulation cavity.

14. The method of claim 13, in which the fluid inlet box further provides a pivot support in contacting adjacency with the plate valve.

15. The method of claim 14, in which the fluid inlet box further provides an extension conduit having a proximal end and a distal end, the proximal end in contacting adjacency with the outlet conduit, the extension conduit conducting fluid from the environment external to the thermal regulation cavity to the thermal regulation cavity.

16. The method of claim 15, in which the extension conduit provides at least a diffusion member affixed to the distal end of the extension conduit, wherein the diffusion member is configured to preclude fluid conducted from the environment external to the thermal regulation cavity from being applied to the process chamber in a stream normal to the process chamber.

17. The method of claim 16, in which the fluid inlet box further provides a pivot pin disposed between the plate valve and the pivot support, the pivot pin promotes displacement of the plate valve from contacting adjacency with the inlet conduit when fluid is drawn into the thermal regulation cavity and deters passage of fluids from the thermal regulation chamber to the environment external to the thermal regulation cavity when fluid is not being drawn into the thermal regulation cavity.

18. The method of claim 17, further comprising a step of securing an inlet manifold to the inlet conduit, the inlet manifold conducting fluid from the environment external to the thermal regulation cavity to the inlet conduit.

19. The method of claim 11, further comprising steps of:

reducing pressure in an outlet manifold to a value below an internal pressure of the inlet conduit, the outlet manifold in fluidic communication with the thermal regulation cavity; and drawing fluid past the plate valve of the fluid inlet box, around the process chamber and out a purge conduit as an outcome of reducing the pressure in the outlet manifold, wherein the purge conduit is disposed.

20. The thermal diffusion chamber of claim 19, in which the process chamber is configured to accommodate a substrate disposed within the process chamber, wherein the substrate has a width of at least substantially 650 millimeters and a length of at least substantially 1650 millimeters.

* * * * *